US008169135B2

(12) United States Patent
Zhai et al.

(10) Patent No.: US 8,169,135 B2
(45) Date of Patent: May 1, 2012

(54) SEMICONDUCTOR LIGHTING DEVICE WITH WAVELENGTH CONVERSION ON BACK-TRANSFERRED LIGHT PATH

(75) Inventors: Jinhui Zhai, Oldsmar, FL (US); Israel J. Morejon, Tampa, FL (US); Thong Bui, Tarpon Springs, FL (US)

(73) Assignee: Lednovation, Inc., Tampa, FL (US)

( * ) Notice: Subject to any disclaimer, the term of this patent is extended or adjusted under 35 U.S.C. 154(b) by 730 days.

(21) Appl. No.: 12/336,695

(22) Filed: Dec. 17, 2008

(65) Prior Publication Data
US 2010/0149814 A1    Jun. 17, 2010

(51) Int. Cl.
*H05B 33/00* (2006.01)
(52) U.S. Cl. ......... 313/501; 313/112; 313/113; 257/678
(58) Field of Classification Search .................. None
See application file for complete search history.

(56) References Cited

U.S. PATENT DOCUMENTS

| | | | |
|---|---|---|---|
| 6,351,069 B1 | 2/2002 | Lowery et al. | |
| 6,576,488 B2 | 6/2003 | Collins, III et al. | |
| 6,630,691 B1 | 10/2003 | Mueller-Mach et al. | |
| 6,696,703 B2 | 2/2004 | Mueller-Mach et al. | |
| 7,061,454 B2 | 6/2006 | Sasuga et al. | |
| 7,213,940 B1 | 5/2007 | Van De Ven et al. | |
| 7,285,791 B2 | 10/2007 | Beeson et al. | |
| 7,352,124 B2 | 4/2008 | Beeson et al. | |
| 7,380,684 B2 | 6/2008 | Reed et al. | |
| 7,387,405 B2 | 6/2008 | Ducharme et al. | |
| 7,390,684 B2 | 6/2008 | Izuno et al. | |
| 2005/0184638 A1* | 8/2005 | Mueller et al. | 313/485 |
| 2007/0221938 A1 | 9/2007 | Radkov et al. | |
| 2007/0223219 A1 | 9/2007 | Medendorp et al. | |
| 2007/0278934 A1 | 12/2007 | Van De Ven et al. | |
| 2008/0006815 A1 | 1/2008 | Wang et al. | |
| 2008/0054281 A1 | 3/2008 | Narendran et al. | |
| 2008/0105887 A1 | 5/2008 | Narendran et al. | |
| 2008/0130285 A1 | 6/2008 | Negley et al. | |
| 2008/0136313 A1 | 6/2008 | Van De Ven et al. | |
| 2008/0170296 A1* | 7/2008 | Chaves et al. | 359/641 |
| 2010/0328926 A1* | 12/2010 | Hoelen et al. | 362/84 |
| 2011/0182056 A1* | 7/2011 | Trottier et al. | 362/84 |

* cited by examiner

*Primary Examiner* — Ashok Patel
(74) *Attorney, Agent, or Firm* — Harvey S. Kauget; Phelps Dunbar LLP

(57) ABSTRACT

A semiconductor lighting device includes a semiconductor light emitter packaged on a reflective substrate to emit a first light and a remote wavelength conversion layer on a back-transferred light path to convert the back-transferred first light into a forward second light. A filter is disposed on a light emitting forward path with a space to the semiconductor light emitter to reflect back at least a portion of the first light. A diffusive member may be positioned outside of the filter to diffuse the forward passing light before it exits from the semiconductor lighting device. As a second aspect of this invention, a solid state lighting device includes a short wavelength semiconductor emitter; a long wavelength semiconductor emitter with wavelength in reddish orange range; a filter on a light emitting forward path to reflect back a portion of short wavelength first light; and a wavelength conversion component on a back-transferred light path. The device produces a mixture of warm white light in a correlated color temperature from 2700~3500 K and color rendering index at least 85 for any indoor lighting application.

12 Claims, 3 Drawing Sheets

SEMICONDUCTOR LIGHTING DEVICE WITH WAVELENGTH CONVERSION ON BACK-TRANSFERRED LIGHT PATH

FIELD OF INVENTION

The invention relates generally to semiconductor lighting devices, as well as related components, systems and methods, and more particularly to a method of remote wavelength conversion to make white light.

BACKGROUND OF THE INVENTION

It is well known that incandescent light bulbs are a very energy inefficient light source—about 90% of the electricity they consume is released as heat rather than light. Fluorescent light bulbs are by a factor of about 10 more efficient, but are still less efficient than a solid state semiconductor emitter, such as light emitting diodes, by factor of about 2.

In addition, incandescent light bulbs have a relatively short lifetime, i.e., typically about 750-1000 hours. Fluorescent bulbs have a longer lifetime (e.g., 10,000 to 20,000 hours) than incandescent lights, but they contain mercury, not an environment friendly light source, and they provide less favorable color reproduction. In comparison, light emitting diodes have a much longer lifetime (e.g., 50,000 to 75,000 hours). Furthermore, solid state light emitters are a very clean "green" light source and can achieve very good color reproduction.

Accordingly, for these and other reasons, efforts have been ongoing to develop solid state lighting devices to replace incandescent light bulbs, fluorescent lights and other light-generating devices in a wide variety of applications. In addition, where light emitting diodes (or other solid state light emitters) are already being used, efforts are ongoing to provide improvement with respect to energy efficiency, color rendering index (CRI Ra), luminous efficacy (1 m/W), color temperature, and or duration of service, especially for indoor applications.

A semiconductor light emitting device utilizes a blue light emitting diode having a main emission peak in the blue wavelength range from 400 nm to 490 nm, and a luminescent layer containing an inorganic phosphor that absorbs blue light emitted by the blue LED and produces an exciting light having an emission peak in a visible wavelength range from green to yellow. The mixture of emitted blue light and excited yellow light produces a white light with correlated color temperature (CCT) around 6500 K.

Almost all the known light emitting semiconductor devices place a phosphor layer in the light emitting path. Phosphors may be disposed in the path of the forward emitted light by a semiconductor light emitting diode in several ways. U.S. Pat. No. 6,351,069 describes an III-V nitride LED covered by a layer of a transparent resin in which a wavelength conversion material is mixed. U.S. Pat. No. 6,630,691 describes growth of LED devices on single crystal luminescent substrates. U.S. Pat. No. 6,696,703 describes the use of thin film phosphor layers disposed over LEDs. U.S. Pat. No. 6,576,488 describes forming conformal phosphor layers on LEDs by electrophoretic deposition. Directly forming a phosphor layer on an LED or mixing into an epoxy resin to encapsulate the LED must handle the temperature rise issue in the LED itself. The intrinsic phosphor conversion efficiency, for some phosphors, drops dramatically as the temperature increases above approximately the 90° C. threshold. Also, phosphor directly-attached to LED will cause more phosphor degradation over heat and time.

Current state-of-the-art phosphor-converted LED (Pc-LED) technology is inefficient due to the backscattering issue. Phosphor particles within a luminescent layer or cured encapsulation layer are randomly oriented and have particles sizes from about 5~50 microns which is much bigger than the wavelength of visible light. A portion of the primary short wavelength light emitted by the LED passes through the phosphor layer without impinging on the phosphor particles, and another portion of the primary light emitted by the LED chip impinges the phosphor particles, causing the phosphor particles to emit longer wavelength radiation or scatter the primary short wavelength light. The impingement of primary short wavelength light onto a down-conversion phosphor layer may produce radiations with four components: a forward-transferred down-converted radiation transmitted through the phosphor layer; a back-transferred down-converted radiation reflected from the phosphor layer; a back-transferred primary short wavelength light reflected from the phosphor layer; and a forward transferred primary short wavelength light transmitted through the phosphor layer. The combination of the forward-transferred primary short wavelength radiation and the forward-transferred down-converted radiation produces white light. But the back-transferred primary radiation and down-converted radiation will mostly reflect back into the primary LED chip in current state-of-the art Pc-LED which phosphor layer directly applied to LED, causing significantly phosphor conversion back-scattering loss.

BRIEF SUMMARY OF THE INVENTION

To overcome the phosphor conversion back-scattering loss and phosphor degradation issues from the known phosphor converted semiconductor lighting device, the present application discloses a method and a system of remote wavelength conversion on light back-transferred path in semiconductor lighting devices. The invention includes a method of semiconductor light emitting device to generate a white light having wavelength conversion on the light back-transferred path and a system of solid state light emitting device to generate a high color rendering warm white light with wavelength conversion on the light back-transferred path.

The semiconductor lighting device includes a semiconductor light emitter packaged on a reflective substrate to emit a short wavelength first light; a filter disposed on a light emitting forward path with a space to the semiconductor light emitter to reflect back at least a portion of the first light; a wavelength conversion layer disposed on a light back-transferred path to convert back-transferred first light from the filter into a forward second light. A diffusive member may be positioned outside of the filter to diffuse the passing light from the filter. As another aspect of this invention, the semiconductor lighting device includes a short wavelength semiconductor emitter; a long wavelength semiconductor emitter having a radiation wavelength in reddish orange range; a filter to reflect back a portion of short wavelength light; and a wavelength conversion component on a back-transferred path to convert the short wavelength light into a forward yellow light. The mixture light of blue color, yellow color and reddish orange color produces a correlated color temperature (CCT) from 2700~3500 K and color rendering index (CRI) at least 85 for all lighting applications.

According to one embodiment of the first aspect of the present invention a new semiconductor white light emitting device based on remote wavelength conversion on back-transferred light path is disclosed. The semiconductor white light emitting device includes a short wavelength light emitting component and a remote wavelength conversion layer on a back-transferred light path inside the semiconductor light emitting device package. A filter is disposed on a light emitting forward path to reflect back at least a portion of primary short wavelength light. The wavelength conversion layer on the light back-transferred path absorbs the reflected short wavelength light and converts it into a forward long wavelength light. Both light emitting components and wavelength conversion layer may be disposed on the thermal conductive substrate which may have a high reflective coating on the top surface to recycle the backscattering light into a forward light. Short wavelength light emitting components may emit a blue light with peak wavelength from 430 nm~470 nm or a near-UV light with peak wavelength from 380 nm~420 nm. The filter may be a long pass dichroic filter or another wavelength conversion layer. The area of the wavelength conversion layer is at least two times of the area of light emitting components to reduce light-scattering loss back to light emitting components. The percentage of short wavelength leakage from the filter can be used to adjust the correlated color temperature (CCT) of the semiconductor light emitting device.

According to one embodiment of the second aspect of the present invention, a new semiconductor light emitting device is disclosed to generate a warm white light with color rendering index at least 80 from a remote wavelength conversion on back-transferred light path. The semiconductor warm white light emitting device includes a semiconductor light emitting component to emit a short wavelength first light; a second light in reddish orange color either emitted from the semiconductor light emitting components or excited from the first light; a wavelength conversion layer deposited on the reflective substrate to absorb reflected first light and excite a forward long wavelength light, preferred in yellow color; and a filter on light emitting forward path to reflect back at least a portion of the first light, but pass through the emitted second reddish orange light and excited long wavelength light. A green light may be also excited from the wavelength conversion layer at back-transferred light path. Short wavelength light emitting components may emit a blue light with peak wavelength from 430 nm~470 nm or a near-UV light with peak wavelength from 380 nm~420 nm. The filter may be a long pass dichroic filter or another wavelength conversion layer. The back-scattering light from the wavelength conversion layer and the filter will be recycled by the reflective substrate.

According to one embodiment of the third aspect of the present invention, a solid state lighting device is disclosed. The solid state white lighting device includes at least one of the above disclosed semiconductor light emitting devices, based on remote wavelength conversion on back-transferred light path.

According to one embodiment of the fourth aspect of the present invention, a new solid state white lighting device is disclosed. The solid state lighting device includes a short wavelength semiconductor light emitting device and a remote wavelength conversion layer on a back-transferred light path inside the solid state lighting device package. The semiconductor light emitting devices are packaged on the reflective substrate of the solid state lighting device. A long pass dichroic filter is disposed on the light emitting forward path with an air space to semiconductor light emitting devices. The filter on light emitting forward path reflects back at least a portion of primary short wavelength light. A wavelength down-conversion layer is deposited on thermal conductive substrate to reduce phosphor degradation from overheating. The wavelength conversion layer absorbs back-transferred short wavelength light and converts it into a forward long wavelength light. A reflective coating may be applied to an inside wall of the solid state lighting device. The short wavelength light emitting components may emit a blue light with peak wavelength from 430 nm~470 nm or a near-UV light with peak wavelength from 380 nm~420 nm. The area of the wavelength conversion layer is at least two times of the area of semiconductor light emitting devices to reduce light-scattering loss back to light emitting devices.

According to one embodiment of the fifth aspect of the present invention, a new warm white solid state lighting device is disclosed. The device uses a remote wavelength conversion on back-transferred light path to generate a mixture light of blue, yellow and a reddish orange spectrum for a warm white solid state lighting device with a good color rendering. The solid state lighting device includes a first group of semiconductor light emitting devices packaged on the thermal conductive substrate and a remote wavelength conversion layer deposited on the reflective substrate to convert back-transferred short wavelength light into a forward long wavelength light. A reddish orange light is emitted from the second group of semiconductor light emitting devices or excited from the first group of semiconductor light emitting devices. A green phosphor may be added into the wavelength conversion layer to compensate for the shortage of bluish green light in the excited yellow light. A long pass dichroic filter is disposed on light emitting forward path to reflect back at least a portion of short wavelength light, but pass through at least 95% of long wavelength light with wavelength longer than 500 nm. A dome diffuser may be positioned outside of dichroic filter to diffuse the mixture light before exported from the solid state lighting device. The short wavelength light emitting components may emit a blue light with peak wavelength from 430 nm~470 nm or a near-UV light with peak wavelength from 380 nm~420 nm. The back-scattering light from the wavelength conversion layer and the diffuser will be recycled by the reflective substrate.

The foregoing has outlined rather broadly the more pertinent and important features of the present invention in order that the detailed description of the invention that follows may be better understood so that the present contribution to the art can be more fully appreciated. Additional features of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constrictions do not depart from the spirit and scope of the invention as set forth in the appended claims.

BRIEF DESCRIPTION OF THE DRAWINGS

Similar reference characters refer to similar parts throughout the several views of the drawings.

DETAILED DESCRIPTION OF THE INVENTION

An object of the present invention is to suppress phosphor converting back-scattering loss and phosphor degradation issues of known phosphor-converted (PC) semiconductor lighting devices by utilizing a remote phosphor conversion method with wavelength conversion at back-transferred light path so as to provide a semiconductor light emitting device and a solid state lighting device exhibiting a high wavelength converting efficiency, a less phosphor degradation and a flexible correlated color temperature (CCT) reconfiguration.

The First Aspect of the Present Invention

According to the first aspect of the present invention, there is provided a system and a method of a semiconductor white light emitting device including at least one short wavelength light emitting component and a remote wavelength conversion layer on a back-transferred light path inside the semiconductor light emitting device package.

Figure 1:
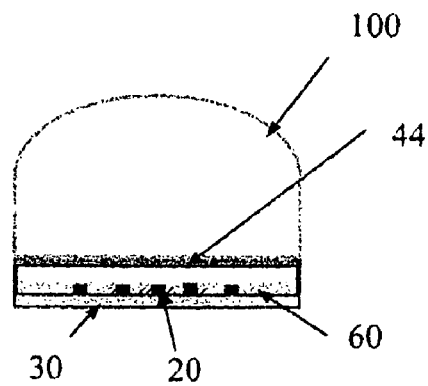
FIG. 1 is a cross sectional view of one embodiment of a solid state lighting device according to the present invention.

As shown in FIG. 1, the semiconductor light emitting device 10 comprising a light emitting component 20 packaged on a reflective substrate 30 to emit a short wavelength first light; a filter 44 disposed on a light emitting forward path 50 with a space to the semiconductor light emitting component 20 to reflect back at least a portion of the first light; a wavelength conversion layer 60 disposed on a light back-transferred path 70 to convert the back-transferred first light from the filter 44 into a forward second light.

The reflective substrate 30 has a good thermal conduction for heat dissipation. The semiconductor light emitting component 20 emits a blue light with peak wavelength range from 430 nm~470 nm, or a near-UV light with peak wavelength range from 380~420 nm. The wavelength conversion layer 60 absorbs the back-transferred short wavelength light and converts it into a yellow light from blue light exciting, or a combination of blue, green and red light for near-UV light exciting. The area of the semiconductor light emitting device substrate 30 is at least two times of the area of the light emitting component 20. The back-scattering light from the wavelength conversion layer 60 is recycled by the reflective substrate 30. The combination of the leakage blue light and the passing through long wavelength excited lights will produce a white light within ten MacAdam ellipses with at least one point on blackbody locus at 1931 CIE.

In some embodiments according to the first aspect of the present invention as shown in FIG. 1, a short wavelength light emitting component 20 is packaged on a reflective substrate 30 of a semiconductor light emitting device 10 to emit a first light in blue color with a peak wavelength range from 430 nm~470 nm. A long pass dichroic filter 44 is disposed on a light emitting forward path 50 with a space to the semiconductor lighting component 20. The long pass dichroic filter 44 reflects back at least a portion of the short wavelength first light, but passes through at least 95% of the long wavelength light with a wavelength longer than 500 nm. A wavelength down-conversion layer 60 is deposited on the reflective substrate 30 surface to absorb the back-transferred first light and convert it into a forward-transferred second light in yellow color or mixture green/red color and passes it through the long pass dichroic filter 44. A dome lens 90 may be disposed on top of the long pass dichroic filter 44 to avoid total internal reflection loss of the converted long wavelength light back into the semiconductor light emitting component 20.

The wavelength down-conversion layer 60 is directly contacted with the thermal conductive substrate 30 for a good heat dissipation to reduce phosphor degradation. A combination of the leakage blue light and the passed excited yellow light from the long pass dichroic filter 44 produces a white light. The percentage of blue light leakage from the long pass dichroic filter 44 can be used to adjust the correlated color temperature (CCT) of the semiconductor white light emitting device 10.

The wavelength down-conversion layer 60 may cover the light emitting component 20. A short pass dichroic filter 42 may be deposited on top of the light emitting component 20 to pass through primary short wavelength light, but reflect back the converted long wavelength light into a forward light and export from the semiconductor light emitting device 10. The space between the short pass dichroic filter 42 and the wavelength down-conversion layer 60 may be air or a transparent encapsulation resin 61.

In some embodiments according to the first aspect of the present invention, a short wavelength light emitting component 20 emits a near-UV spectrum light with a peak wavelength range from 380 nm~420 nm. The wavelength down-conversion layer 60 comprising a mixture of blue, green and red quantum dots or of yellow quantum dots, or a combination required for a high color rendering white light device. The long pass dichroic filter 44 reflects back at least 98% of the near-UV spectrum light and passes through at least 95% of the visible light with a wavelength longer than 430 nm. The wavelength down-conversion layer 60 may cover the light emitting component 20.

The Second Aspect of the Present Invention

According to the second aspect of the present invention, there is provided a system and a method of remote wavelength conversion on a back-transferred light path to generate a mixture light of blue, yellow and a reddish orange spectrum for a warm white semiconductor light emitting device with a good color reproduction.

Figure 2A:
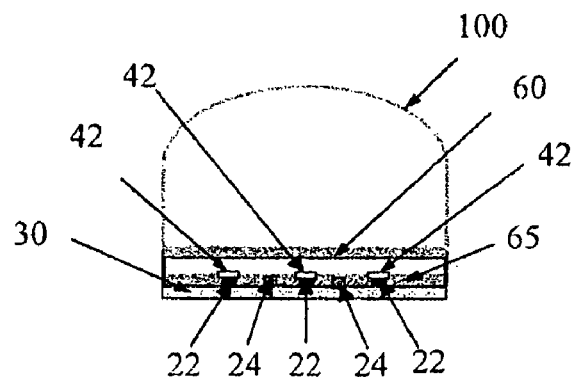
FIG. 2A is a cross sectional view of one embodiment of a solid state lighting device according to the present invention.
Figure 2B:
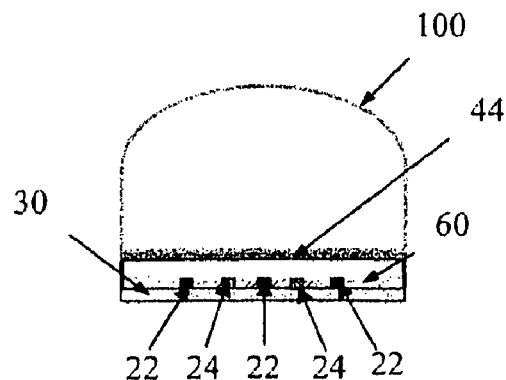
FIG. 2B is a cross sectional view of one embodiment of a solid state lighting device according to the present invention.

In some embodiments according to the second aspect of the present invention as shown in FIG. 2A and FIG. 2B, a light emitting component 20 packaged on a reflective substrate 30 includes a group of first light semiconductor blue emitters 22 with a peak wavelength range from 430 nm~470 nm and a group of second light semiconductor reddish orange emitters 24 with a peak wavelength range from 610 nm~620 nm. The emitted second light passes through the long pass dichroic filter 44 and at least some of the emitted first light is reflected at the long pass dichroic filter 44 into a back-transferred light. A wavelength down-conversion layer 60 deposited on top of the reflective substrate 30 absorbs the back-transferred first light and converts it into a forward third light in yellow color with a peak wavelength range from 550 nm~580 nm. The combination of leakage emitted first light blue color, pass through emitted second light reddish orange color and excited third light yellow color will produce a warm white light with a color rendering index at least 80.

In some embodiments according to the second aspect of the present invention, a light emitting component 20 packaged on a reflective substrate 30 includes a first light semiconductor blue emitter 22 with a reddish orange phosphor deposited on top of the emitter 22 and yellow phosphor layer around the emitter 22 on the reflective substrate 30. The reddish orange phosphor absorbs some of the first blue light with a peak wavelength range from 430 nm~470 nm and converts it into a second reddish orange light with a peak wavelength range from 610 nm~620 nm, which passes through the long pass dichroic filter 44. The leakage first blue light from the reddish orange phosphor hits the long pass dichroic filter and is reflected into a back-transferred light at the long pass dichroic filter 44. The yellow phosphor absorbs the back-transferred first blue light and converts into a third forward yellow light and passes through the long pass dichroic filter 44. A green phosphor may be added into yellow phosphor to excite a fourth green light from the first blue light. The combination of leakage emitted first light blue color, passing through emitted second light reddish orange color and excited third light yellow color and fourth green color produces a warm white light with a color rendering index at least 85.

In some embodiments according to the second aspect of the present invention, a warm white semiconductor light emitting device 10 includes a short wavelength light emitting component 20 and two wavelength conversion phosphors 60, 65 disposed on a light back-transferred path 70. The short wavelength light emitting component 20 is packaged on the reflective substrate 30 of a semiconductor light emitting device 10 to emit a first light in either blue color or near-UV color. A filter 44 is disposed on a light emitting forward path 50 with a space to the semiconductor lighting component 20 is a first wavelength down-conversion phosphor layer 60 to absorb at least a portion of the short wavelength first light and converts it into a second light, preferred in a yellow color with a peak wavelength range from 550 nm~580 nm. A portion of the short wavelength first light is scattered back by the first phosphor particles. A second wavelength down conversion phosphor 65 is deposited on the reflective substrate 30 to absorb the back-transferred light and convert it into a third light, including a reddish orange color with a peak wavelength range from 610 nm~620 nm. A green phosphor may be added into the second phosphor layer 65 to excite a green light to compensate for the shortage of bluish green spectrum in the excited yellow light. The back-scattering light from the wavelength conversion layers 60, 65 is recycled by the reflective substrate 30.

The Third Aspect of the Present Invention

According to the third aspect of the present invention, there is provided a system and a method of a solid state white lighting device 10 including at least one of the above disclosed semiconductor light emitting devices 10 based on remote wavelength conversion on a back-transferred light path 70.

Figure 3:
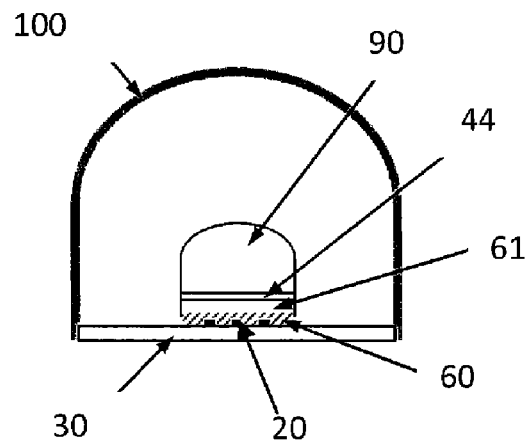
FIG. 3 is a cross sectional view of one embodiment of a solid state lighting device according to the present invention.

In some embodiments according to the third aspect of the present invention as shown in FIG. 3, a solid state lighting device 10 comprising a semiconductor light emitting component 20 with a remote wavelength conversion layer 60 on a back-transferred light path 70; a power string line 80 connecting the semiconductor light emitting component 20; and a diffusive member 100 to diffuse the light from the semiconductor light emitting component 20. When a power is applied to the power string line 80, the output diffused light produces a white light with a good color rendering.

The Fourth Aspect of the Present Invention

According to the fourth aspect of the present invention, there is provided a system and a method of a solid state white lighting device 10 with a short wavelength semiconductor light emitting component 20 and a remote wavelength conversion layer 60 on a back-transferred light path 70 inside the solid state lighting device 10 packages.

Figure 4:
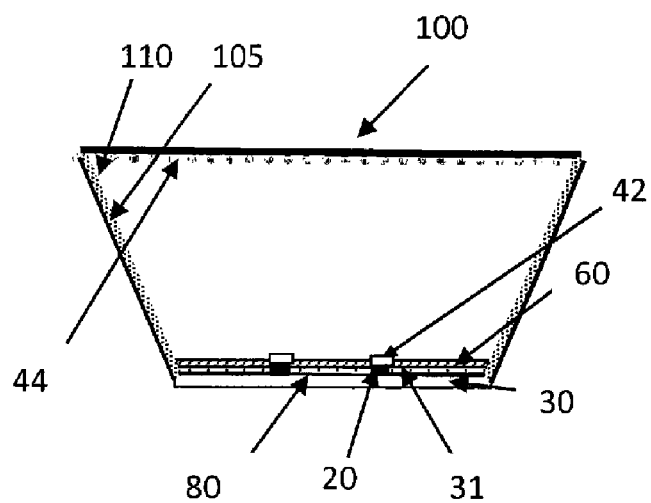
FIG. 4 is a cross sectional view of one embodiment of a solid state lighting device according to the present invention.
Figure 6:
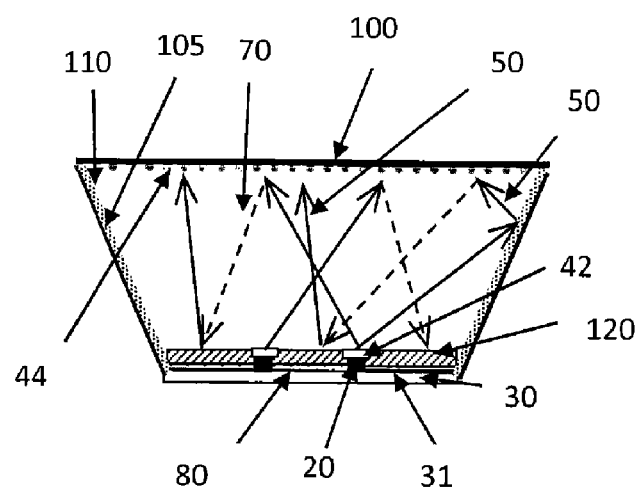
FIG. 6 is a cross sectional view of one embodiment of a solid state lighting device according to the present invention.

In some embodiments according to the fourth aspect of the present invention as shown in FIGS. 4 and 6, a solid state lighting device 10 comprising a semiconductor light emitting component 20 packaged on a reflective substrate 30 of the solid state lighting device 10; a long pass dichroic filter 44 disposed on a light emitting forward path 50 with an air space to the semiconductor light emitting component 20; a wavelength down-conversion layer 60 deposited on a thermal conductive substrate 30; a power string line 80 connected to the semiconductor light emitting component 20; and a light diffuser 100 positioned on top of the long pass dichroic filter 44. A reflective coating 110 may be applied to the inside wall 105 of the solid state lighting device 10.

When power is applied to the power string line 80, the semiconductor light emitting component 20 emits a first blue light with a peak wavelength rangy from 430 nm~470 nm. The long pass dichroic filter 44 reflects back at least a portion of the first blue light, but passes through 95% of the long wavelength light with a wavelength longer than 500 nm. The wavelength down-conversion layer 60 absorbs the back-transferred first blue light and converts it into a forward-transferred second light in yellow color or mixture green/orange color and passes through the long pass dichroic filter 44. The light diffuser 100 on top of the long pass dichroic filter 44 diffuses the passing light from the long pass dichroic filter 44. The back-scattering light from the wavelength down-conversion layer 60 and the diffuser 100 is recycled by the reflective layer 31 on the substrate 30. The mixture of leakage blue emitted light and pass through excited long wavelength light produce a white light within ten MacAdam ellipses with at least one point on a blackbody locus at 1931 CIE. The area of wavelength down-conversion layer 60 is at least two times of the area of the semiconductor light emitting component 20. The percentage of short wavelength leakage from the long pass dichroic filter 44 can be used to adjust the correlated color temperature (CCT) of the solid state lighting device 10.

In some embodiments according to the fourth aspect of the present invention, the wavelength down-conversion layer 60 may cover the semiconductor light emitting component 20. A portion of a first blue light is directly absorbed by the wavelength down-conversion layer 60 and converted into a long wavelength light. A portion of the first blue light is leakage from the wavelength down-conversion layer 60 on top of the semiconductor light emitting component 20, but reflected by the long pass dichroic filter 44 into a back-transferred light and gets converted at the remote wavelength conversion layer 60 around the semiconductor light emitting component 20. The converted forward long wavelength light passes the long pass dichroic filter 44 and mixes with the leakage blue light to generate a white light.

In some embodiments according to the fourth aspect of the present invention, a short-pass dichroic filter 42 may be deposited on top of the semiconductor light emitting component 20. The emitted first blue light passes through the short-pass dichroic filter 42, but the back-transferred converted long wavelength light is reflected at the short-pass dichroic filter 42 into a forward-transferred light and exported from the solid state lighting device 10 to reduce absorption loss of the back-transferred light into the semiconductor light emitting component 20.

The Fifth Aspect of the Present Invention

According to the fifth aspect of the present invention, there is provided a system and a method of remote wavelength conversion on a back-transferred light path 70 to generate a mixture light of blue, yellow and a reddish orange spectrum for a warm white solid state lighting devices 10 with a good color rendering.

Figure 5:
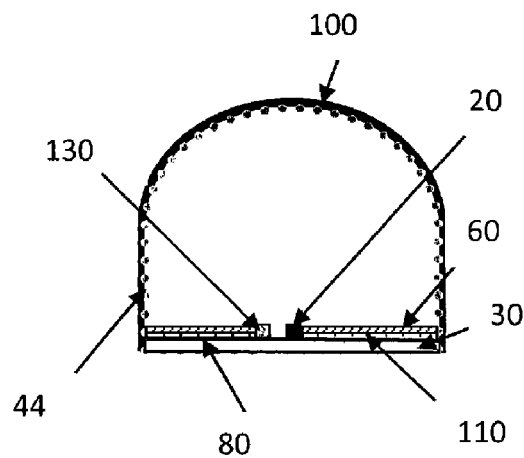
FIG. 5 is a cross sectional view of one embodiment of a solid state lighting device according to the present invention.

In some embodiments according to the fifth aspect of the present invention as shown in FIG. 5, a solid state lighting device 10 comprising a semiconductor blue light emitting component 22 and a semiconductor reddish orange light emitting component 24 packaged on a reflective substrate 30; a power string line 80 connected to the two groups of semiconductor light emitting component 22, 24; a wavelength down-conversion layer 60 deposited on top of a thermal conductive substrate 30 for remote wavelength conversion on a back-transferred path 70; a dome shape diffuser 100 and a dichroic filter 44 coated inside of the diffuser 100.

The semiconductor blue light emitting component 22 emits a first blue light with peak wavelength from 430 nm~470 nm and the semiconductor reddish orange light emitting component 24 emits a second light with peak wavelength from 610 nm~620 nm to compensate for the shortage of red light in excited yellow light for a high color rendering. The blue and red semiconductor light emitters may have a reflector layer 110 under the active emitting layer in the die structure. A green phosphor 120 may be added into the yellow wavelength conversion layer 60 to further compensate for the shortage of bluish green light in excited yellow light for an even high color rendering solid state lighting device. Both reddish orange and green light directly pass through the dichroic filter 44 and the diffuser 100. The wavelength down-conversion layer 60 is deposited on the thermal conductive substrate 30 to reduce the phosphor degradation. The back-scattering lights from the wavelength conversion layer 60 and the diffuser 100 is recycled by the reflective substrate 30. The mixture of emitted first blue light emitted reddish orange light, excited yellow light and/or green light produces a warm white light with color rendering index at least 85. The percentage of short wavelength leakage from the dichroic filter 44 can be used to adjust the correlated color temperature (CCT) of the solid state lighting device 10.

In some embodiments according to the fifth aspect of the present invention, the solid state lighting device 10 includes a semiconductor short wavelength light emitting component 20 packaged on a reflective substrate 30 and an excited reddish orange and/or green light 130 to improve the color rendering index of the solid state lighting device 10. A reddish orange phosphor may be added into a wavelength down-conversion yellow phosphor layer 60 to absorb a back-transferred short wavelength first light and convert it into a reddish orange light to compensate for the shortage of red light in the excited yellow light. The reddish orange phosphor layer may be only applied on top of the semiconductor light emitting component 20 to directly absorb a portion of the short wavelength first light and convert it into reddish orange light. The wavelength down-conversion layer 60 may excite a mixture of yellow and green light. The mixture wavelength down-conversion layer 60 can be used to adjust the correlated color temperature (CCT) of the solid state lighting device 10.

In some embodiments according to the fifth aspect of the present invention, the solid state lighting device 10 includes a semiconductor light emitting component 20 packaged on a reflective substrate 30 of the solid state lighting device 10 to emit a near-UV first light with a wavelength range of 380 nm~420 nm. The long pass dichroic filter 44 reflects back at least 98% of the near-UV spectrum light and passes through at least 95% of the visible light with a wavelength longer than 430 nm. The wavelength down-conversion quantum dots layer 60 on a back-transferred path 70 to absorb the near-UV first light and excite one blue, one green and one red light and pass through the filter 44 and the diffuser 100. The back-scattering long wavelength light is recycled by the reflective substrate 30. The solid state lighting device 10 produces a warm white light with a color rendering index at least 85.

In some embodiments according to the fifth aspect of the present invention, the solid state lighting device 10 includes a semiconductor short wavelength light emitting component 20 packaged on a reflective substrate 30 and a wavelength down-conversion layer 60 deposited on top of the conductive substrate 30 to excite a yellow light. The wavelength down-conversion layer 60 may be a separated ceramic wavelength conversion plate, a lumiramic phosphor plate, or polymer phosphor film. The separate wavelength down-conversion component can be used to flexibly adjust the correlated color temperature (CCT) of the solid state lighting device 10.

In some embodiments according to the fifth aspect of the present invention, the solid state lighting device 10 includes a semiconductor short wavelength light emitting component 20 packaged on a reflective substrate 30 and a wavelength down-conversion layer 60 deposited on top of the conductive substrate 30 to excite a yellow light and/or combination with another long wavelength light. The wavelength down-conversion layer 60 has multiples phosphor coated areas 120, including a phosphor coated area for exciting yellow light from the first blue exciting light and another phosphor coated area for exciting reddish orange light from the first blue exciting light. The multiple phosphor coated area 120 wavelength down-conversion layer 60 are aligned to the specific semiconductor light emitting component 20 to convert a first short wavelength light into yellow and reddish orange lights and mixed inside the solid state lighting device 10 before exported from the diffuser 100.

In some embodiments according to the fifth aspect of the present invention, the solid state lighting device 10 includes a semiconductor near-UV light emitting device packaged on a reflective substrate 30 and a wavelength down-conversion layer 60 deposited on top of the conductive substrate 30 to excite a blue, a green and a red light. The wavelength down-conversion layer 60 has multiples quantum dots coated areas, including a first quantum dots coated area for exciting blue light from the first near-UV exciting light and a second quantum dots coated area for exciting green light from the first near-UV exciting light and a third quantum dots coated area for exciting red light from the first near-UV exciting light. The multiple quantum dots coated wavelength down-conversion layer 60 is aligned to the specific semiconductor light emitting component 20 to convert the first near-UV wavelength light into blue, green and red lights and mixed inside the solid state lighting device 10 before exported from the diffuser 100.

It is understood that the above description is intended to be illustrative and not restrictive. Although various characteristics and advantages of certain embodiments of the present invention have been highlighted herein, many other embodiments will be apparent to those skilled in the art without deviating from the scope and spirit of the invention disclosed. The scope of the invention should therefore be determined with reference to the claims contained herewith as well as the full scope of equivalents to which said claims are entitled.

Now that the invention has been described,

What is claimed is:
1. A solid state lighting device comprising:
a semiconductor light emitting component packaged on a reflective substrate, said semiconductor light emitting component emitting a primary first light;
a long pass dichroic filter disposed to receive said primary first light that is emitted from said semiconductor light emitting component, said long pass dichroic filter reflecting back at least 50% of said primary first light that is emitted from said semiconductor light emitting component;
a first wavelength down-conversion layer on said reflective substrate, said first wavelength down-conversion layer absorbing said reflected primary first light from said long pass dichroic filter, said reflected primary first light from said long pass dichroic filter exciting a forward second light from said first wavelength down-conversion layer;

a light diffuser member positioned on top of said long pass dichroic filter; and a power line electrically connected to semiconductor light emitting component.

2. The solid state lighting device according to claim 1, further comprising:

said primary first light that is emitted from said semiconductor light emitting component is a blue light having a peak wavelength range from about 430 nm to 470 nm; and said forward second light that is emitted from said first wavelength down-conversion layer is a yellow light having a peak wavelength range from about 550 nm to 570 nm.

3. The solid state lighting device according to claim 1, further comprising:

said primary first light that is emitted from said semiconductor light emitting component is a blue light having a peak wavelength range from about 430 nm to 470 nm; and said forward second light that is emitted from said first wavelength down-conversion layer is a mixture of green light and orange light.

4. The solid state lighting device according to claim 1, further comprising:

said primary first light that is emitted from said semiconductor light emitting component is a near-UV light having a peak wavelength range from about 380 nm to 420 nm; and said forward second light that is emitted from said first wavelength down-conversion layer is a mixture of blue light, green light and red light.

5. The solid state lighting device according to claim 1, further comprising a reflective coating around an interior wall of said solid state lighting device.

6. The solid state lighting device according to claim 1, wherein said wavelength down-conversion layer covers said semiconductor light emitting component.

7. The solid state lighting device according to claim 1, further comprising a second wavelength conversion layer mixed into said first wavelength down-conversion layer, said reflected primary first light from said long pass dichroic filter exciting a yellow light from said first wavelength conversion layer, said yellow light having a peak wavelength range from about 550 nm to 570 nm and said reflected primary first light from said long pass dichroic filter exciting a third reddish orange light from said second wavelength conversion layer, said third reddish orange light having a peak wavelength range from about 610 nm to 620 nm.

8. The solid state lighting device according to claim 1, further comprising a reddish orange wavelength conversion layer deposited on top of said semiconductor light emitting component, said reddish orange wavelength conversion layer absorbing a portion of said reflected primary first light from said long pass dichroic filter said reflected primary first light from said long pass dichroic filter exciting a reddish orange light from said reddish orange wavelength conversion layer, said reddish orange light having a peak wavelength range from about 610 nm to 620 nm.

9. The solid state lighting device according to claim 1, wherein said wavelength conversion layer further comprising a multiple phosphor coated area.

10. The solid state lighting device according to claim 9, wherein said multiple phosphor coated area further comprising a yellow phosphor coating area and a reddish orange phosphor coating area.

11. The solid state lighting device according to claim 1, wherein said semiconductor light emitting device further comprising:

a first group of semiconductor light emitting components packaged on said reflective substrate, said first group of semiconductor light emitting components emitting a primary first blue light having a peak wavelength range from about 430 nm to 470 nm;

a second group of semiconductor light emitting components packaged on said reflective substrate, said second group of semiconductor light emitting components emitting a second reddish orange light having a peak wavelength range from about 610 nm to 620 nm;

said long pass dichroic filter disposed inside of a diffusive window, said long pass dichroic filter receiving said primary blue light that is emitted from said first group of semiconductor light emitting components, said long pass dichroic filter reflecting back said primary blue light that is emitted from said first group of semiconductor light emitting components; and said first wavelength down-conversion layer absorbing said reflected primary first blue light from said long pass dichroic filter, said reflected primary first blue light from said long pass dichroic filter exciting a second yellow light from said first wavelength down-conversion layer.

12. The solid state lighting device according to claim 11, wherein said wavelength down-conversion layer is selected from the group consisting of a separated ceramic wavelength conversion plate, a lumiramic phosphor plate and a polymer phosphor film.

* * * * *

UNITED STATES PATENT AND TRADEMARK OFFICE
CERTIFICATE OF CORRECTION

PATENT NO. : 8,169,135 B2
APPLICATION NO. : 12/336695
DATED : May 1, 2012
INVENTOR(S) : Jinhui Zhai et al.

It is certified that error appears in the above-identified patent and that said Letters Patent is hereby corrected as shown below:

Column 4, lines 49-50: "constrictions" should be "constructions"

Column 8, line 8: "rangy" should be "range"

Column 8, line 59: "devices" should be "device"

Signed and Sealed this
Twelfth Day of June, 2012

David J. Kappos
*Director of the United States Patent and Trademark Office*